United States Patent
Meynants (10) Patent No.: US 7,408,195 B2
(45) Date of Patent: Aug. 5, 2008

(54) SEMICONDUCTOR PIXEL ARRAYS WITH REDUCED SENSITIVITY TO DEFECTS

(75) Inventor: Guy Meynants, Retie (BE)

(73) Assignee: Cypress Semiconductor Corporation (Belgium) BVBA, Mechelen (BG)

( * ) Notice: Subject to any disclaimer, the term of this patent is extended or adjusted under 35 U.S.C. 154(b) by 0 days.

(21) Appl. No.: 10/655,248

(22) Filed: Sep. 4, 2003

(65) Prior Publication Data

US 2005/0051775 A1    Mar. 10, 2005

(51) Int. Cl.
    *H01L 27/14* (2006.01)
(52) U.S. Cl. ...................................... 257/72
(58) Field of Classification Search ........... 257/292, 257/E27.133, E27.152, 88–93, 444, 910, 257/72, 59, 359; 250/208.1; 348/308; 345/90–99
See application file for complete search history.

(56) References Cited

U.S. PATENT DOCUMENTS

| | | | | |
|---|---|---|---|---|
| 5,708,263 A * | 1/1998 | Wong | ............. | 250/208.1 |
| 5,861,620 A * | 1/1999 | Takahashi et al. | ......... | 250/208.1 |
| 6,008,486 A * | 12/1999 | Stam et al. | ............... | 250/208.1 |
| 6,215,113 B1 * | 4/2001 | Chen et al. | ............... | 250/208.1 |
| 6,255,638 B1 * | 7/2001 | Eraluoto et al. | .......... | 250/208.1 |
| 6,359,605 B1 * | 3/2002 | Knapp et al. | ................ | 345/76 |
| 6,452,153 B1 * | 9/2002 | Lauxtermann et al. | ... | 250/208.1 |
| 6,493,030 B1 * | 12/2002 | Kozlowski et al. | .......... | 348/310 |
| 6,518,559 B2 * | 2/2003 | Endo et al. | ............... | 250/208.1 |
| 6,529,049 B2 * | 3/2003 | Erhart et al. | ................ | 327/94 |
| 6,552,319 B2 * | 4/2003 | Pyyhtia et al. | ........... | 250/208.1 |
| 6,577,302 B2 * | 6/2003 | Hunter et al. | ............... | 345/204 |
| 6,580,063 B1 * | 6/2003 | Okamoto | ............. | 250/208.1 |
| 6,580,455 B1 * | 6/2003 | Wang et al. | ............. | 348/308 |
| 6,605,850 B1 * | 8/2003 | Kochi et al. | ............... | 257/431 |
| 6,697,114 B1 * | 2/2004 | Merrill | ............. | 348/308 |
| 6,756,954 B2 * | 6/2004 | Yamamoto et al. | ............ | 345/87 |
| 6,777,660 B1 * | 8/2004 | Lee | ............. | 250/208.1 |
| 6,795,117 B2 * | 9/2004 | Tay | ............. | 348/241 |
| 6,809,768 B1 * | 10/2004 | Merrill | ............. | 348/308 |
| 6,831,691 B1 * | 12/2004 | Takada et al. | ............... | 348/308 |
| 6,917,027 B2 * | 7/2005 | Krymski | ............. | 250/208.1 |
| 6,924,167 B1 * | 8/2005 | Hopper et al. | ............... | 438/57 |
| 6,937,025 B1 * | 8/2005 | Fong et al. | ............... | 324/522 |
| 6,947,088 B2 * | 9/2005 | Kochi | ............. | 250/208.1 |
| 6,972,794 B1 * | 12/2005 | Wang et al. | ............... | 348/302 |
| 7,068,312 B2 * | 6/2006 | Kakumoto et al. | .......... | 348/241 |
| 7,138,967 B2 * | 11/2006 | Kimura | ............. | 345/76 |
| 7,154,454 B2 * | 12/2006 | Okabe et al. | ................ | 345/76 |
| 2002/0024606 A1 * | 2/2002 | Yuki et al. | ............. | 348/302 |
| 2002/0134911 A1 * | 9/2002 | Zarnowski et al. | ....... | 250/208.1 |
| 2003/0214468 A1 * | 11/2003 | Inukai | ............. | 345/82 |
| 2004/0056831 A1 * | 3/2004 | Takatori et al. | ............... | 345/88 |

OTHER PUBLICATIONS

Mendis, Sunetra K. et al., "Progress in CMOS Active Pixel Image Sensors", Proc. SPIE, vol. 2172, pp. 19-29.
Fossum, Eric R., "Active Pixel Sensors: Are CCD's Dinosaurs?", Proc. SPIE, vol. 1900, pp. 2-14.

* cited by examiner

*Primary Examiner*—Nathan W Ha
(74) *Attorney, Agent, or Firm*—Blakely, Sokoloff, Taylor & Zafman LLP (57) ABSTRACT

A pixel structure is described, comprising at least two selection switches coupled in series to improve the yield of the pixel. Also an array comprising such pixel structures logically organized in rows and columns is described, as well as a method for selecting a row or column of pixel structures in such an array.

21 Claims, 5 Drawing Sheets

SEMICONDUCTOR PIXEL ARRAYS WITH REDUCED SENSITIVITY TO DEFECTS

TECHNICAL FIELD OF THE INVENTION

The present invention relates to the field of semiconductor device structures, especially transistor, diode and pixel structures, more particularly to a pixel structure, that shows an improved yield. The present invention also relates to a method for operating such a semiconductor device structure.

BACKGROUND OF THE INVENTION

CMOS image sensors are well-known and are being implemented for a long time now. A good summary of CMOS sensors can be found in S. Mendis et al., "Progress in CMOS Active Pixel Sensors", Proc. SPIE vol.2172, p. 19 (1994) and in E. Fossum, "Active Pixel Sensors: Are CCD's Dinosaurs?", Proc. SPIE vol. 1900, p. 2 (1994). The latest document explains that it is difficult to achieve large array sizes with charge-coupled devices because of the high charge transfer efficiency required and the high vulnerability to single point defects.

Figure 1:
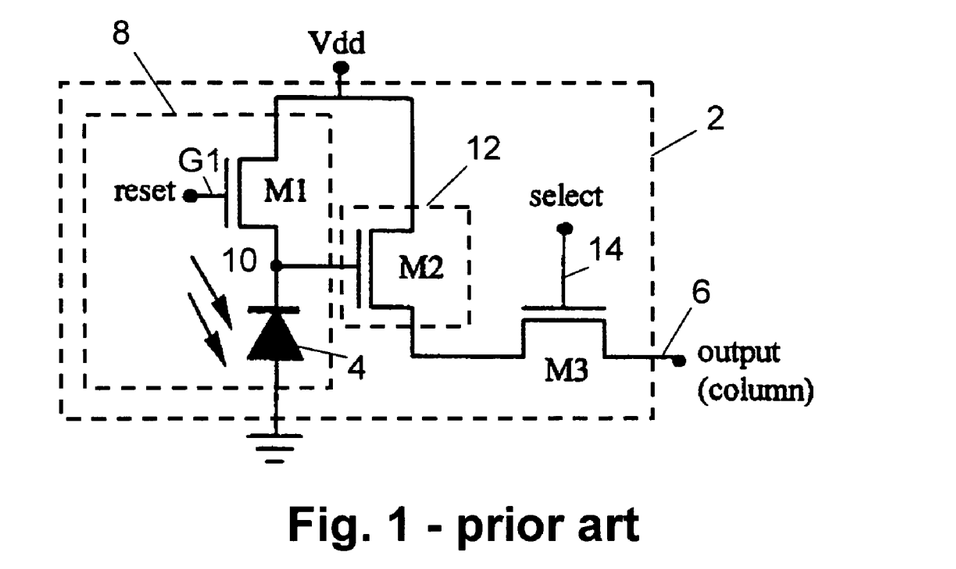
FIG. 1 is an illustration of a prior art three-transistor active pixel.

Several CMOS implementations have been explored. Passive pixels have been used in the past because of the smaller dimensions of the pixel cell, but these are inherently noisy. Since the last ten years, active pixels have been the first choice for CMOS pixel designs. An active pixel has amplification means inside the pixel, which offers low noise. A conventional implementation of an active pixel is a three-transistor active pixel design as shown in FIG. 1. The input signal to an active pixel 2 is the radiation intensity at the location of that pixel. The radiation may be any suitable radiation such as optical light, IR light, UV light, high energy particles, X-rays, etc. In the following, embodiments of the present invention will be described with reference to incident light. The incident light intensity is transduced by a photosensitive element such as a photodiode 4 and its associated circuits to an analog voltage at the output line 6 of the pixel 2. The sensing is done via a sensor circuit 8, comprising a reverse-biased photodiode 4 and a reset transistor M1. The photodiode 4 is reset periodically to a fixed bias by means of reset transistor M1, which is coupled between the reverse-biased photodiode 4 and a (positive) power supply VDD. Transistor M1 pre-charges the junction capacitance of the photodiode 4 at the beginning of every integration period when a reset signal reset is applied to the gate G1 of the reset transistor M1. The photodiode 4 collects photogenerated charges, e.g. charge carriers such as electrons (a semiconductor silicon substrate exposed to photons results in a release of charge carriers) and discharges in proportion to the integration period and the photocurrent of the photodiode 4. The current that the photons of the light generate in the photodiode 4 is directly related to the incident light. For a linear device the current generated is preferably proportional to the light intensity.

The connection between the reset transistor M1 and the photodiode 4 is the photodiode node 10. In the embodiment of FIG. 1, a signal integrated in the photodiode 4 is present on the photodiode node 10 and can be consequently sensed by a buffer 12, for example comprising buffer transistor M2, and read out in a conventional line-addressing/column readout fashion by the line select transistor M3. The combination of transistors M2 and M3 is only one possible implementation of a buffer/multiplexer. Many other schemes are possible for that part, and are known to a person skilled in the art.

The column output line 6 may end in a current load or a resistive load (not represented in FIG. 1) and will forward the pixel signal to a column amplifier or another type of amplifier (whereby the type is considered not to be a limitation on the present invention).

A plurality of pixels are arranged in an array to form an imaging device, such as a camera for example. Every semiconductor pixel array has a certain yield. For CMOS active pixel arrays, the yield can be about 80% that may certainly be subject to improvement.

SUMMARY OF THE INVENTION

It is an object of the present invention to improve the yield of semiconductor pixel arrays.

The above objective is accomplished by a method or a device according to the present invention.

The present invention provides an array of pixel structures which are logically organised in rows and columns, wherein each pixel structure comprises at least two row selection switches or column selection switches coupled in series to improve the yield of the pixel. The pixel structures may be active pixels or passive pixels. At least one of the at least two selection switches may be a selection transistor such as a MOSFET for example.

Two selection switches of a pixel structure may each be coupled to a separate select line.

One row or column of pixel structures may share a plurality of select lines, each nth selection switch of the pixel structures on one row or column being connected to an nth select line. This means that different selection switches are driven by different select lines. The select lines associated with one row or column of pixel structures may extend in parallel.

An array according to the present invention may furthermore be provided with means for driving the select lines. The means for driving the select lines may be adapted to apply a same select signal to a plurality of select lines associated with one row or column, or it may be adapted to apply a different select signal to a plurality of select lines associated with one row or column.

One of the select lines associated with a row or column of pixel structures may be a control line of another row or column of pixel structures, such as a reset line for example.

The present invention furthermore provides a method for selecting a row or column of pixel structures in an array of pixel structures logically organised in rows and columns, the method comprising selecting the row or column of pixel structures by applying a first signal to a first select line associated with the row or column of pixel structures, and, at the same time, selecting the row or column of pixel structures by applying a second signal to a second select line associated with the row or column of pixel structures.

The first and the second signal may be the same signals or may be different signals.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

It is also to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The present invention is based on a finding of the inventor that CMOS pixels can have a weakness, namely the select lines 14 used to access the pixels. The select line 14 controls the selection transistor M3 of a pixel, and, when a plurality of pixels are arranged in an array having rows and columns, a select line may control the selection of a row of pixels inside the array. A first supply level on the select line 14 switches the output of pixel 2 connected to that select line 14 to a column bus of the pixel array. The first supply level may e.g. be a high level, for NMOS implementations, or a low level, for PMOS implementations. A defect of a select line can cause a pixel or a row of pixels to be selected all the time, i.e. is always on, thereby disturbing the readout of other pixels or other rows of pixels. A device, such as e.g. an imaging device, with such a defect select line is not usable and therefore diminishes the yield of CMOS active pixel arrays.

A short-circuit between the photodiode 4 and the select line 14 inside a three-transistor active pixel 2 as in FIG. 1 does also make the device completely inoperable. From the moment that the pixel or row of pixels on which the defect occurs is reset and the photodiode(s) 4 start charging again, that pixel or row of pixels will be permanently selected (until the photodiode is discharged again). This affects at least the readout of the next rows.

In more complex pixels (not represented in the drawings), other types of shorts may also cause the device to fail.

The present invention can increase the yield of CMOS pixel sensors. The CMOS pixel sensors may comprise active pixels or passive pixels. A passive pixel sensor is simply a photodiode (MOS or p-n junction diode) with a transistor that passes photoelectrically generated signal charge to an amplifier outside the pixel array, i.e. located at the end of a column or row. The term "active pixel" refers to any pixel that has an active element, that is, at least one amplifier that typically comprises one or more transistors, which is associated locally with the pixel.

Figure 2:
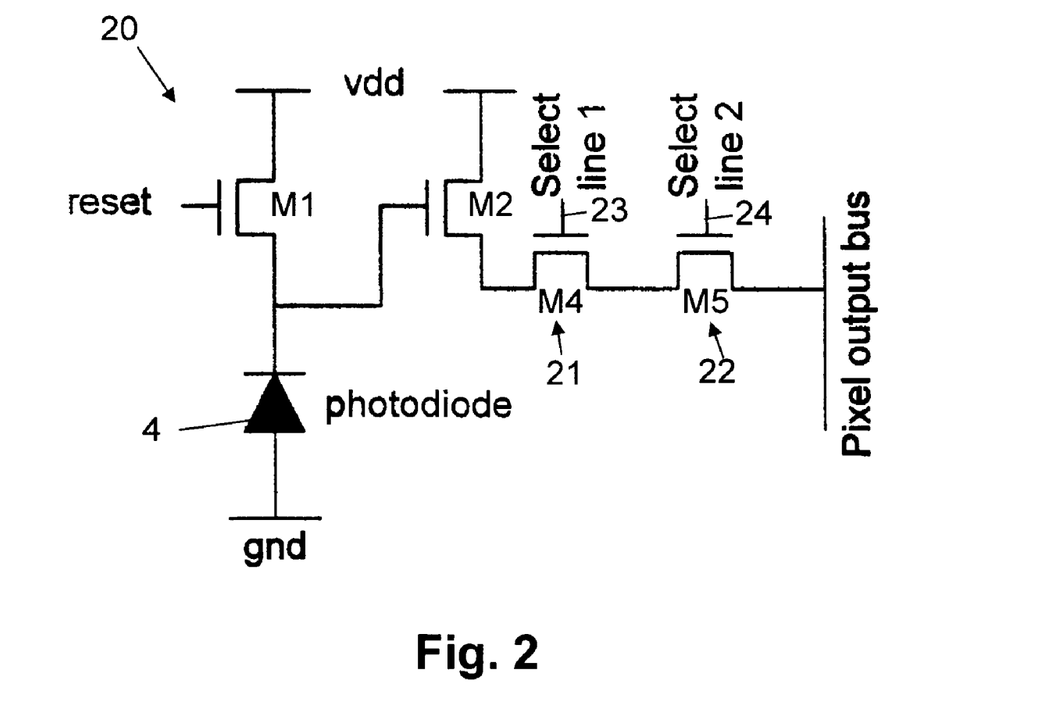
FIG. 2 is an illustration of an active pixel with two selection MOSFETs according to an embodiment of the present invention.
Figure 3:
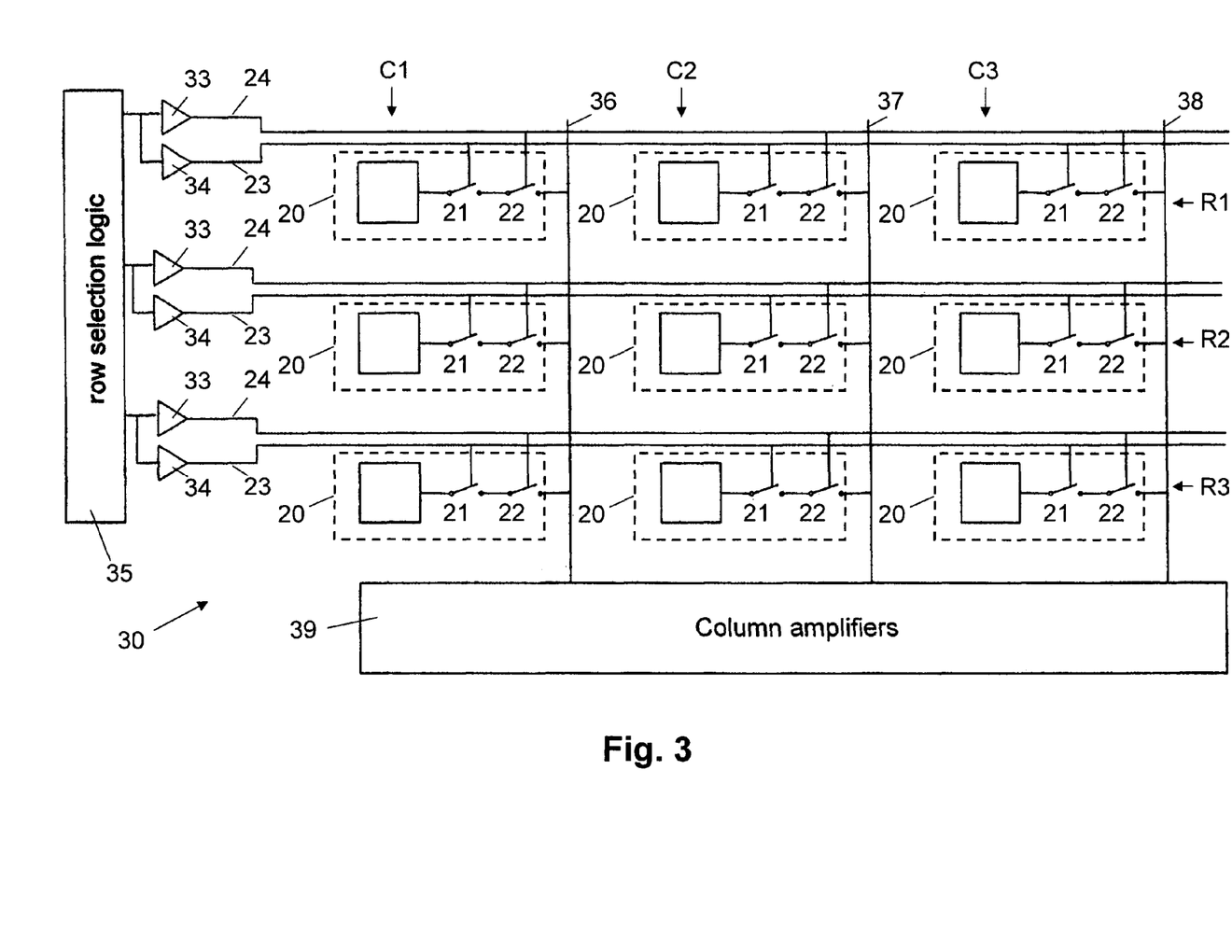
FIG. 3 illustrates an imager array comprising a plurality of active pixels each having two selection switches according to an embodiment of the present invention, all first selection switches of pixels of one row being driven by a first select line and all second selection switches of pixels of one row being driven by a second select line.
Figure 4:
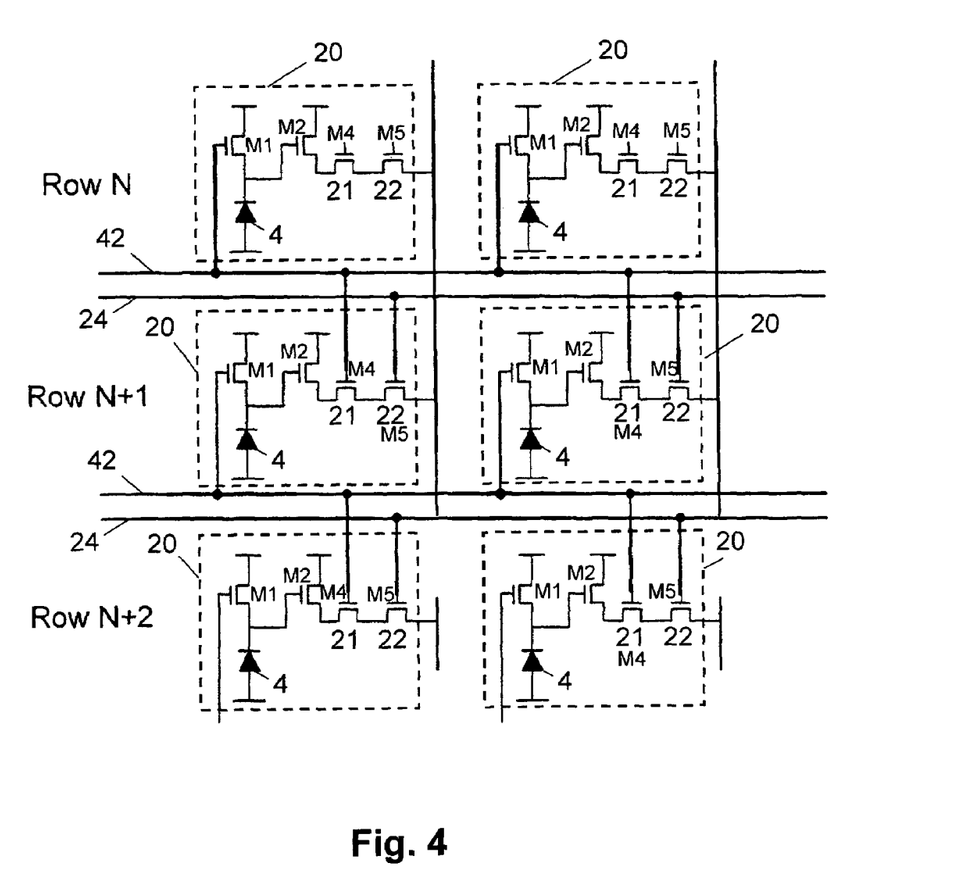
FIG. 4 illustrates an imager array according to an embodiment of the present invention comprising a plurality of active pixels each having two selection switches as in FIG. 3, whereby the second select line is shared with the reset line of a previous line of pixels.

An embodiment according to the present invention makes use of a plurality of, i.e. at least two, series-connected selection switches 21, 22 for a CMOS pixel 20, as shown in FIG. 2 to FIG. 4. Such selection switches 21, 22 may e.g. be formed by selection transistors M4, M5. Each of these selection switches M4, M5 is controlled by its own select line 23, 24.

If a defect occurs on one of the lines 23 or 24 that connects that line to the first voltage level, e.g. a high voltage for an NMOS implementation or a low voltage for a PMOS implementation, the pixel of the row of pixels will not be permanently selected. Such fatal defect will only occur if both lines 23, 24 are connected to a third node on the first supply level, i.e. a high voltage for NMOS implementation or a low voltage for the PMOS implementation of he selection switch.

FIG. 2 shows an implementation of an embodiment of the present invention in a type of active pixel which is basically the same as a conventional active pixel illustrated in FIG. 1, but the invention is not limited to this type of pixel. Alternative active pixels with another number of MOSFETs, with PMOS transistors or with charge transfer steps inside the pixels may be provided that can also benefit from the present invention and are included within the scope of the present invention.

According to an embodiment of the present invention, as illustrated in FIG. 3, a matrix 30 of pixels 20, each pixel 20 comprising at least two selection switches, a first selection switch 21 and a second selection switch 22, is logically organised in rows R1, R2, R3 and columns C1, C2, C3. Throughout this description, the terms "horizontal" and "vertical" (related to the terms "row" and "column" respectively) are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns however the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organised rows and columns. By this is meant that sets of memory elements are linked together in a topologically linear intersecting manner; however, that the physical or topographical arrangement need not be so. For example, the rows may be circles and the columns radii of these circles and the circles and radii are described in this invention as "logically organised" rows and columns. Also, specific names of the various lines, e.g. reset line and first and second select line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

All first selection switches 21 of a row of pixels in the array are connected to a first select line 23, and all second selection switches 22 of that row of pixels are connected to a second select line 24. Preferably, the select lines 23, 24 are parallel and driven by separate drivers 33, 34. They can be driven by identical signals, but this is not a requirement; that is they may be driven by different signals. There may be an advantage in driving both lines with different signals, for example in the case where one of the select lines 23, 24 also drives another control signal inside the pixel, for example a reset line 42 (see further). Which of the select lines 23, 24 will select the pixels 20 of a row R1, R2, R3 is selected by means of row selection logic 35, as known by a person skilled in the art.

All pixels 20 of a column C1, C2, C3 in the array 30 are connected with their outputs to a column bus 36, 37, 38. When a row R1, R2, R3 of the array is selected for read-out, the corresponding select lines 23, 24 are brought at the first supply level, so that the two selection switches 21, 22 provide a connection of the pixels 20 of the selected row with the respective column busses 36, 37, 38. The selection switches 21, 22 provide a connection when the switches are closed, or when the transistors are brought in an ON-state for example. The values of the pixels 20 read-out on the column busses 36, 37, 38 are fed to column amplifiers 39 in a conventional manner, and may e.g. be fed to a visualisation unit such as a screen, or stored in a suitable memory device for later use.

Figure 5:
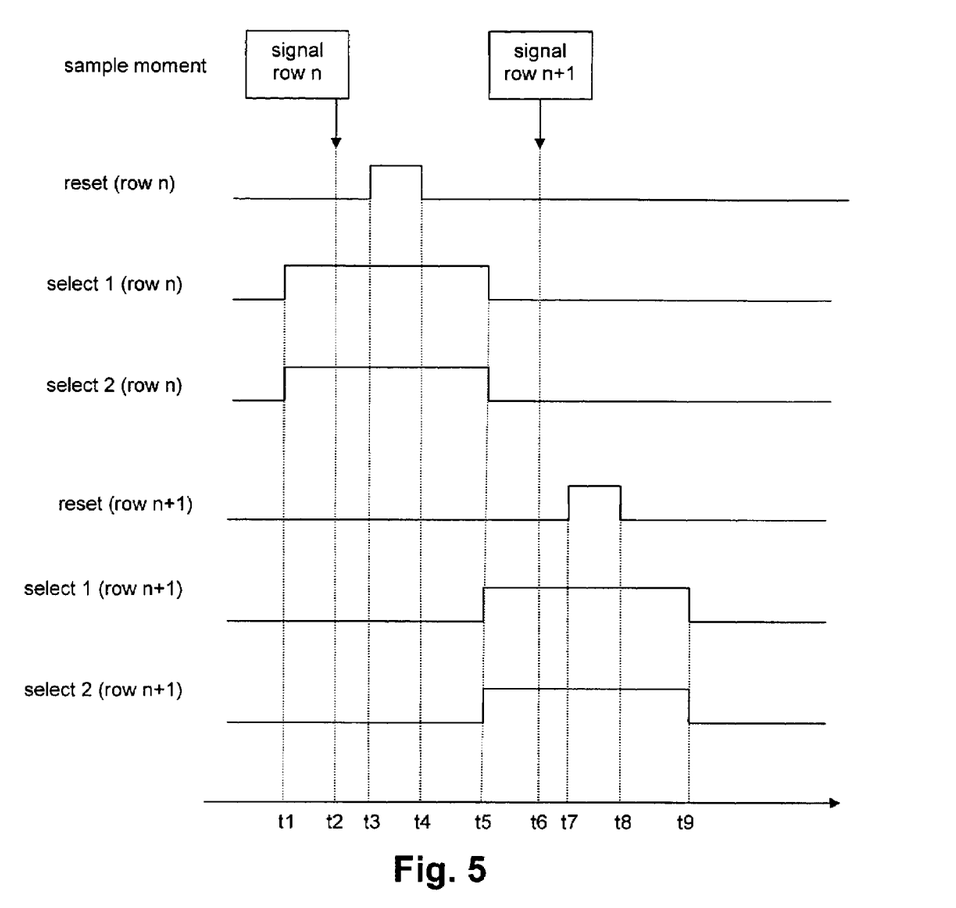
FIG. 5 illustrates timing diagrams for a standard active pixel with two select lines driven by identical signals. In the diagrams, sample moments for the pixels are identified by the dotted vertical lines.

FIG. 5 illustrates timing diagrams for a standard active pixel with two select lines 23, 24 driven by identical signals. Sample moments for the pixels are identified by the dotted vertical lines.

At moment t1, a signal on the first and second select lines 23, 24 of a row n take on a value so as to switch on the first selection switches 21 and the second selection switches 22 of all pixels 20 of row n. At a moment t2, when the first and second selection switches 21, 22 are still switched on, pixel signals of the pixels 20 on row n are sampled by outputting their values to column buses 36, 37, 38. Between moment t3 and moment t4, pixels 20 on row n are reset, and thereafter, at moment t5, the first and second selection switches 21, 22 of row n are switched off by changing the signals on the first and second select lines 23, 24. At the same time, first and second select lines 23, 24 of row n+1 take on a value so as to switch on the first and second selection switches 21, 22 of all pixels 20 of row n+1. At moment t6, the values of the pixels 20 on row n+1 are read out and between moments t7 and t8, the pixels of row n+1 are reset. At moment t9, the first and second selection switches 21, 22 of row n+1 are switched off by changing the signals on the first and second select lines 23, 24.

In the implementation as described above, a pixel presented according to the present invention requires an additional line in the pixel array 30, or more than one additional line if more selection switches are used for each pixel. This is not a problem for large pixels, but for small pixels it limits the fill factor. The fill factor of a pixel is the ratio of the photosensitive area of the pixel to the total area of the pixel.

An alternative implementation of the present invention without this fill factor penalty takes a reset line 42 (or another control line) of the pixels of the next or previous row to drive one of the selection transistors, for example the first selection transistor 21. FIG. 4 shows such an implementation. The second selection transistor 22 is driven by a select line 24 as before. This means that, while resetting a previous row of pixels, e.g. after read-out of that row, a next row of pixels may be driven for read-out by selecting the pixels of the next row.

With this embodiment, a classic rolling shutter pixel can be designed with only two horizontal lines per pixel 20, a first line 42 used for both resetting pixels 20 of a previous line and at the same time selecting first selection switches 21 of pixels 20 of a current line; and a second line 24 for selecting second selection switches 22 of pixels 20 of the current line. A timing circuit has to take care that the line is reset correctly.

Figure 6:
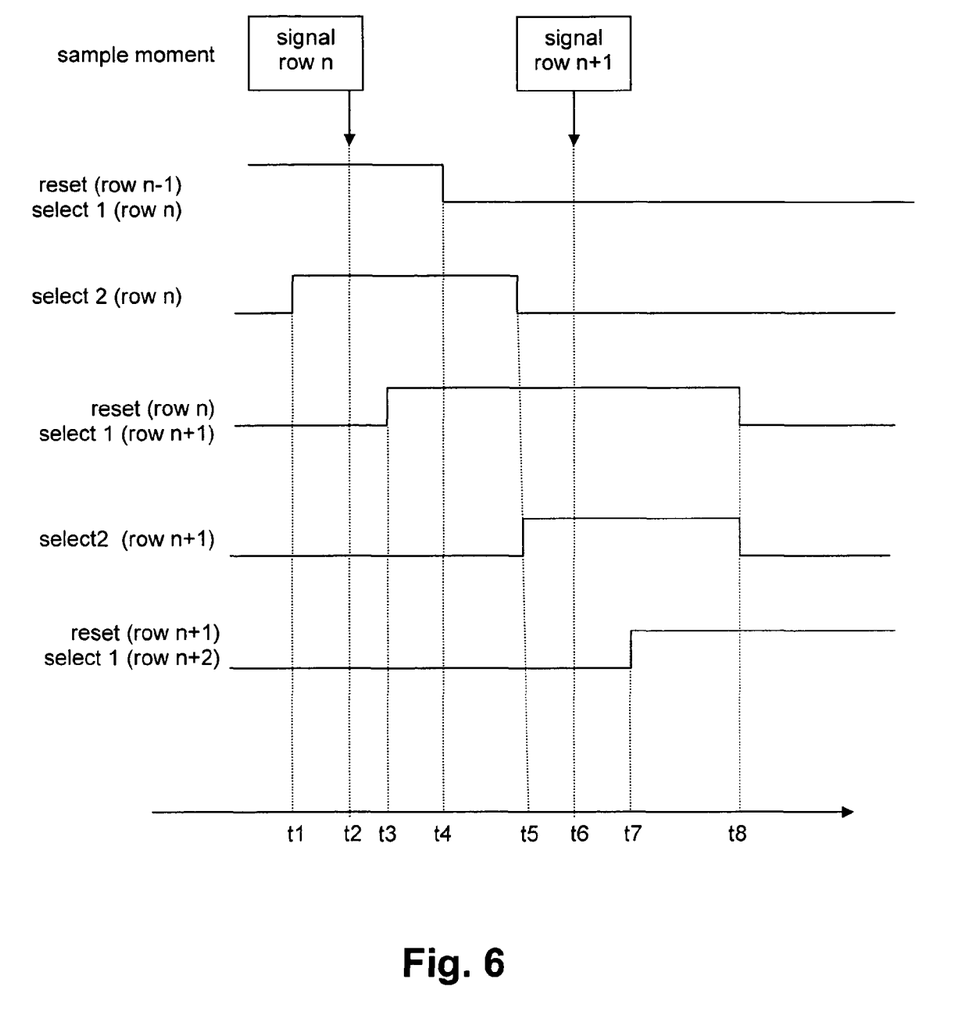
FIG. 6 illustrates timing diagrams for a standard active pixel where one of the select lines is shared with another pixel control line, in the case represented with a reset line.

This is illustrated in FIG. 6, which gives timing diagrams for an active pixel where one of the selection lines is shared with a pixel control line, in the present case a reset line, of another row. At moment t1, a signal on the second select line 24 of row n takes on a value so as to switch on the second selection switch 22 of all pixels 20 of row n. At that moment, a signal on the first select line 42 of row n, being also the reset line of row n−1, had already previously taken on a value so as to switch on the first selection switch 21 of all pixels 20 of row n. At a moment t2, when the first and second selection switches 21, 22 are still switched on, pixel signals of the pixels 20 on row n are sampled by outputting their values to column buses 36, 37, 38. At moment t3, pixels 20 on row n are reset, and at the same moment, first selection switches 21 of pixels of row n+1 are switched on. At t4, the first selection switches 21 of row n are switched off and the reset of pixels of row n−1 is stopped by changing the signals on the combined first select line of row n and reset line or row n−1 42. At t5, the second selection switches 22 of row n are switched off. At the same time, second select line 24 of row n+1 takes on a value so as to switch on the second selection switches 22 of all pixels 20 of row n+1. At that moment, first selection switches 21 of all pixels 20 of row n+1 are already switched on. At moment t6, the values of the pixels 20 on row n+1 are read out. At moment t7, pixels 20 on row n+1 are reset, and at the same moment, first selection switches 21 of pixels of row n+2 are switched on. At t8, the first selection switches 21 of row n+1 are switched off and the reset of pixels of row n is stopped by changing the signals on the combined first select line of row n and reset line or row n−1 42. Also the second selection switches 22 of row n+1 are switched off.

It is to be understood that although preferred embodiments, specific constructions and configurations, as well as materials, have been discussed herein for devices according to the present invention, various changes or modifications in form and detail may be made without departing from the scope and spirit of this invention. For example, all examples given above include two selection switches per pixel. However, this is not intended to be limiting, and any number of selection switches larger than 1 can be used. Furthermore, other implementations for timing diagrams are as well possible, for example a pixel with in-pixel charge transfer will require a reset before the charge is transferred, and in that case the implementation is more straightforward but the timing is different from the ones given. This lies within the skills of a person skilled in the art.

What is claimed is:

1. An array of pixel structures which are logically organized in rows and columns, wherein each pixel structure is associated with a row and a column, each pixel structure comprising:
 a photosensitive element; and
 a first row selection ON/OFF switch, associated with a first row and coupled to a first row select line for that row, to receive a first row select signal, and a second row selection ON/OFF switch, associated with the first row and coupled to a second row select line for that row, to receive a second row select signal that has a different timing from the first row select signal; or
 a first column selection ON/OFF switch, associated with a first column and coupled to a first column select line for that column, to receive a first column select signal, and a second column selection ON/OFF switch, associated with the first column and coupled to a second column select line for that column, to receive a second column select signal that has a different timing from the first column select signal;
 wherein each of the row selection ON/OFF switches or column selection ON/OFF switches is coupled in series between the photosensitive element and a pixel output line.

2. An array according to claim 1, wherein the pixel structures are active pixels.

3. An array according to claim 1, wherein at least one of the two row selection ON/OFF switches or the two column selection ON/OFF switches is a selection transistor.

4. An array according to claim 3, wherein the selection transistor is a MOSFET.

5. An array according to claim 1, wherein the pixel structures are passive pixels.

6. An array according to claim 1, wherein one row or column of pixel structures shares a plurality of select lines, each nth selection ON/OFF switch of the pixel structures on one row or column being connected to an nth select line.

7. An array according to claim 6, wherein the plurality of select lines associated with the one row or column of pixel structures extends in parallel.

8. An array according to claim 1, further comprising at least two drivers, each driver coupled to one of the select lines to drive the coupled select line.

9. An array according to claim 8, wherein the at least two drivers are configured to apply a different select signal to each of the select lines, wherein the select lines are associated with one row or column.

10. An array according to claim 1, wherein one of the select lines is associated with a row or column of pixel structures and is a control line of another row or column of pixel structures.

11. An array according to claim 10, wherein the control line is a reset line.

12. An apparatus, comprising:
 means for generating a photoelectric signal charge;
 first means for selecting a pixel structure at one or more a distinct row or a distinct column within a pixel via a first select signal;
 second means for selecting the pixel structure at one or more of the distinct row or the distinct column via a second signal that has a different timing than the first select signal, the first and second means for selecting coupled in series between the means for generating the photoelectric signal charge and a pixel output line, wherein the first and second means for selecting are both row selection means coupled to different row select lines for the distinct row or both column selection means coupled to different column select lines for the distinct column; and
 means for preventing permanent selection of the pixel structure.

13. The apparatus of claim 12, further comprising first means for driving the first means for selecting and second means for driving the second means for selecting.

14. The apparatus of claim 12, further comprising means for resetting a second pixel structure, wherein the means for resetting the second pixel structure is coupled to the first means for selecting.

15. The apparatus of claim 12, further comprising first means for outputting a readout signal from the pixel structure.

16. An apparatus, comprising:
 a sensor circuit including a photodiode and a reset transistor, the sensor circuit configured to receive radiation and to output an electrical signal;
 a buffer transistor coupled to the sensor circuit to receive the electrical signal from the sensor circuit; and
 a selection circuit coupled to the buffer transistor to receive the electrical signal from the buffer transistor, the selection circuit comprising a first selection transistor and a second selection transistor coupled between the buffer transistor and a pixel output line, the first selection transistor coupled to a first select line of a distinct row or a distinct column to receive a first select signal via the first select line, and the second selection transistor coupled to a second select line of the distinct row or the distinct column to receive a second select signal via the second select line, the second select signal being different from the first select signal, wherein the first and second select lines are both row select lines or both column select lines.

17. The apparatus of claim 16, wherein the first and second selection transistors are coupled in series.

18. The apparatus of claim 16, further comprising:
 a driver circuit coupled to the first and second select lines to supply the first select signal and the second select signal to the first and second select lines, respectively;
 an output line coupled to the selection circuit to receive a readout signal from the selection circuit;
 a power supply coupled to the sensor circuit and the buffer transistor to supply a voltage to the sensor circuit and the buffer transistor; and
 a second sensor circuit of a second pixel structure, coupled to the first select line, to receive the first select signal and use the first select signal as a reset signal to the second sensor circuit.

19. An array of pixel structures which are logically organized in rows and columns, wherein each pixel structure is associated with a row and a column, and comprises a photosensitive element and at least two row selection ON/OFF switches, each associated with the same row and coupled to a different row select line for that row, or at least two column selection ON/OFF switches, each associated with the same column and coupled to a different column select line for that column, each of the row selection ON/OFF switches or column selection ON/OFF switches coupled in series between the photosensitive element and a pixel output line, wherein each of the row selection ON/OFF switches is configured to receive a same row select signal or each of the column selection ON/OFF switches is configured to receive a same column select signal.

20. An array according to claim 19, wherein one row or column of pixel structures shares a plurality of select lines, each nth selection ON/OFF switch of the pixel structures on one row or column being connected to an nth select line.

21. An array according to claim 19, further comprising at least two drivers, each driver coupled to one of the select lines to drive the coupled select line.

\* \* \* \* \*